(12) United States Patent
Haller et al.

(10) Patent No.: US 7,224,190 B2
(45) Date of Patent: May 29, 2007

(54) MIDCYCLE LATCH FOR POWER SAVING AND SWITCHING REDUCTION

(75) Inventors: Wilhelm Haller, Remshalden (DE); Rolf Sautter, Bondorf (DE); Monika Strohmer, Sindelfingen (DE); Klaus Thumm, Pfalzgrafenweiler (DE)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 11/009,830

(22) Filed: Dec. 10, 2004

(65) Prior Publication Data
US 2005/0134316 A1    Jun. 23, 2005

(30) Foreign Application Priority Data
Dec. 17, 2003    (EP) ............... 031 04 770

(51) Int. Cl.
*H03K 19/096*    (2006.01)
(52) U.S. Cl. ............... 326/95; 326/97; 326/98
(58) Field of Classification Search ......... 326/93–98
See application file for complete search history.

(56) References Cited

U.S. PATENT DOCUMENTS 5,796,282 A * 8/1998 Sprague et al. ............. 327/210
5,841,304 A * 11/1998 Tam ............................ 327/161

OTHER PUBLICATIONS

Monotoye et al., "A Double precision Floating Point Multiplier", ISSCC 2003, vol. 46, pp. 336, Digest of technical papers, Visuals Supplement, pp. 270, no month.

* cited by examiner

*Primary Examiner*—Anh Q. Tran
(74) *Attorney, Agent, or Firm*—John E. Campbell; Lawrence D. Cutter; Heslin, Rothenberg, Farley & Mesiti

(57) ABSTRACT

The present invention relates to the field of hardware logic circuits and in particular to dynamic hardware logic implemented in computer processors, and more particularly, to an integrated circuit comprising a dynamic logic function implementing a predetermined logic function with a plurality of transistor stacks, the integrated circuit comprising a precharge node at the input of said logic function implementation, an output latch connected to the output node of said logic function for stabilizing the result of the evaluation of said logic function. The present invention provides such integrated dynamic circuit with a latch, which is protected against instability even in situations involving complex logic functions which are evaluated and their output states are saved by said output latch.

6 Claims, 2 Drawing Sheets

MIDCYCLE LATCH FOR POWER SAVING AND SWITCHING REDUCTION

BACKGROUND OF THE INVENTION

1. Field of the Invention

The present invention relates to the field of hardware logic circuits and in particular to dynamic hardware logic implemented in computer processors.

2. Description and Disadvantages of Prior Art

In particular high-clocked computer processors are implemented in dynamic logic, which involves a respective cycle-related high switching activity. Such high switching activities of fast dynamic circuits result in 3 to 4 times the power consumption compared to static hardware logic solutions, which are by far slower than dynamic solutions. The high power consumption is due to the clocking and the precharging activities required in dynamic logic. Precharging dynamic logic is a general task for keeping the input lines of any logic function at a properly defined voltage level at the beginning of each cycle independently of the setting of the input lines of said logic function, before the input data enters the circuit. Considering the road map of the CMOS technology, leakage problems—being the reason why precharging is necessary—will follow next as major power consumer besides the regular precharge after the dynamic node has been discharged after valid input signals.

In prior art there are several possibilities to reduce power. One is to turn off the logic and the clocking in case of long-term inactivities. These measures are known under the pseudonyms sleep mode and nap modes. Such measures can be applied for example in laptops or other handheld computing devices, where the idle times are very high. In high-end systems, however, with high utilization this is of no use.

The problems of prior art dynamic logic are further detailed with the example of DOMINO-type dynamic logic as follows and with reference to FIG. 1.

Domino type dynamic logic is a clocked logic. The clock (CLK) controls the precharge phase of a dynamic gate 136 implementing some given logic function. During this phase a dynamic node 134 within the gate is loaded (precharged) to "1". This is done in every cycle independent of the logic state of the input depicted with variable names H_1, H_2, H_3, I_1, I_2, and L_0 exemplarily in FIG. 1.

During the evaluation phase the dynamic load is either discharged or holds its charged state. Compared to a purely static gate, which doesn't switch at all if the input signal is stable, the dynamic logic consumes power for the clocking itself and the precharge of the dynamic node.

In R. Montoye et. al., "A Double precision Floating Point Multiply", ISSCC 2003, Vol. 46, pp. 336, Digest of technical papers, Visuals Supplement, pp. 270, so-called digital mid-cycle latches are disclosed connected at the output of such dynamic logic function for saving the states of a respective last evaluation phase of the logic function.

FIG. 1 shows such latch 138 as published in above reference to reduce the switching activities. However, the latch setup time and the stability of the latch are crucial for acceptance in real applications:

First, the set-up time for the latch 138 reduces the speed of the circuit. Second, the latch 138 can only be applied, when the logic function 136 is quite simple, and limited to quite short stacks of transistors connected in series in a path between precharge node and a foot device 112 connected to ground, wherein said transistor stacks must not be larger in number than only two or three stacks switched in parallel. Thus, this prior art approach with such mid-cycle latch is of limited value only.

When, for example, the logic function 136 is more complex, for example has a larger plurality of transistor stacks having a length of 4 transistors including the foot transistor device 112, this prior art approach does not work anymore, as the input to the latch 138 is too instable due to the fact that the precharged node 134 turns ON transistor 111 (T11). Going from precharge to evaluation, the clock turns ON transistor 109 (T9) as well, while the dynamic node 134 still holds the value of "1". So, transistors 111 (T11) and 109 (T9) are active and pull node 132 to ground. But actually, this should not happen, because the logic function 136 pulls the dynamic node 134 to "0" as well, but with a certain switching delay.

In particular with reference to FIG. 1 only a logic function comprising a stack of 3 transistors T2, T3, T4/T5, and a second stack of two transistors T2, T6, and a third stack of one transistor T7 including a universal foot transistor 112, has been combined with LSDL latches for experimental purposes. Experience shows, however, that the latch 138 is not stable enough and the circuit is error prone. The reason for that instability will be explained as follows for sake of completeness:

Assume that the 11_node 132 is set to "1" and the dynamic node is precharged to "1". During the precharge phase the switching transistor 111 (T11) is switched ON, and the transistor T9 is turned OFF. Transistor T10 is also OFF, because the latch 138 is set to "1". When the clk_p at node 130 is pulled to "1", the evaluation phase starts. Transistor 109 T9 is turned ON immediately. If the logic function in the N-Fet stack is too complex, it takes some time to pull the dynamic node 134 to "0". Transistor 111 T11 can thus still be switched ON and starts to pull the 11_node 132 to "0". If that level erroneously is propagated to the output (latch_out), the predecessing dynamic gate—latch 138— changes its state, which is not recoverable and would produce a severe hardware error. Such instability is thus not tolerable.

OBJECTIVES OF THE INVENTION

It is thus an objective of the present invention to provide such integrated dynamic circuit with a latch, which is protected against instability even in situations of more complex logic functions to be evaluated and their output states to be saved by such output latch.

SUMMARY OF THE INVENTION

This objective of the invention is achieved by the features stated in enclosed independent claims. Further advantageous arrangements and embodiments of the invention are set forth in the respective subclaims. Reference should now be made to the appended claims.

According to the invention illustrated exemplarily by FIG. 2 the following technical features are applied:

a) the gate of a switching transistor device being connected to an input node for receiving a clock signal shared with said logic function, and the drain thereof being connected to the input node of said output latch, b) the gate of a transistor device being connected to said precharge node the source being connected to ground, c) delay-controlling elements being connected between said clock signal input node and the control input of said switching transistor device, and d) said time-controlling elements being dimensioned such that a predetermined delay is imparted to the control input of said switching transistor device, wherein e) the time control of the switching transistor device is implemented such that it stabilizes the bit value present on the latch input node in such a way, that said transistor protects the actual value of the latch input node, until said dynamic node has a stable value during the evaluation phase. In other words, the time control of the switching transistor device is implemented such that it stabilizes the bit value present on the latch input node against its instability caused by the switching delay of the complex logic.

It is thus avoided, that the precharge value of said precharge node can cause a switching on said latch input node, as transistors are activated before the complex logic has reached a stable state.

It should be noted that the term "connected" may include also any intermediate circuit element such as a very low-OHM resistance or others, the influence of which is neglectable with respect to the circuit's function.

The transistor stacks are advantageously implemented in CMOS DOMINO type hardware logic.

By that the following advantages result:

First, and with reference to FIG. 2, the latch 238 is protected for stability by output transistors T21 and T22 against crosstalk incoming via the output line.

Second, a splitted clock for the complex logic 236 and the latch 238 is provided to improve stability of the latch and to control latch setup time.

Third, additional devices like bleeder, duplicated logic paths, and discharge devices for charge sharing reduction and switching time improvement, respectively, can be combined within this inventional approach.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 2:
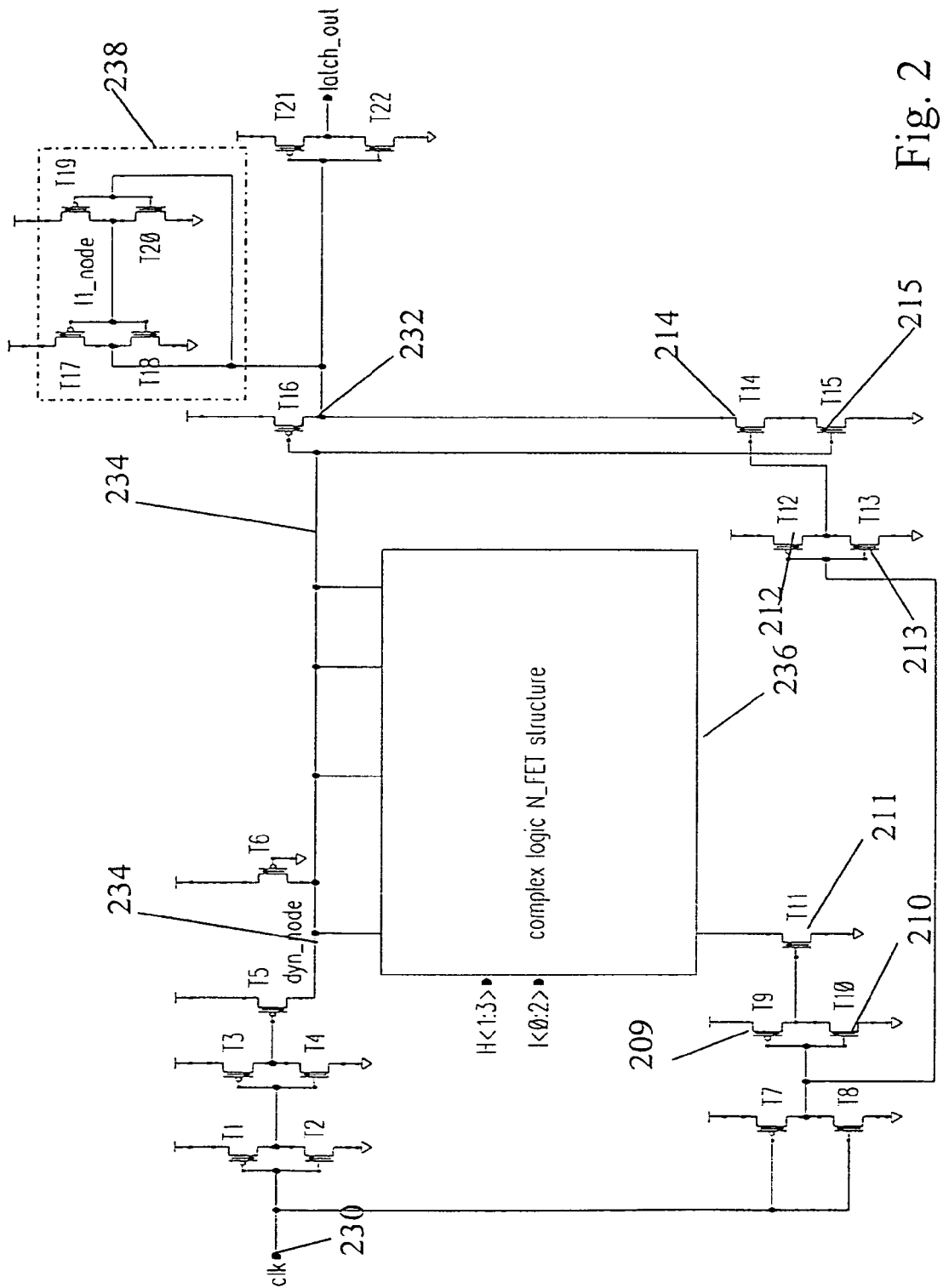
FIG. 2 is a circuit diagram according to a preferred embodiment of the present invention showing a protected output latch by aid of an inventional protective mechanism.

With general reference to the figures and with special reference now to FIG. 2 this figure shows a complex function in a "black box" 236 in order to increase legibility and clarity of the inventional components in the depicted circuit, which is implemented in the N-FET stacks as described above, and a latching device 238 at the output. The latch 238 saves the state of the last evaluation phase. The latch changes its state only if the logic function actually changes its value.

The speed advantage of the dynamic devices has to pay off for the delay of the latch 238 to achieve also a performance gain. As a complex function 236 gains more than just a less complex one, it is crucial that the latch 238 can handle the problems mentioned above in prior art section. This is particularly true, the more complex logic function 236 is.

The latch 238 in FIG. 2 including the clocking and timing circuitry according to the invention may be considered as a set, which can handle such complex functions. This will be illustrated as follows:

According to this preferred embodiment, the integrated circuit depicted in FIG. 2 comprises a dynamic logic function 236 implementing a predetermined logic function with a plurality of transistor stacks as described above, but it may be more complex than that working in prior art.

Further, a precharge node 234 is provided, as usual in dynamic logic, at the input of said logic function implementation 236, an output latch 238 is connected to the output node 232 of said logic function for stabilizing the result of the evaluation of the logic function 236. In order to avoid a switching of the latch caused by a transition from precharge to evaluate phase, the timing control of transistor 214 (T14) is controlled in a particular way described further below.

According to a first aspect of the invention, a switching transistor device 214 gate terminal is connected to the input node 230 via delay control elements further described below, for receiving a clock signal shared with said logic function, and its drain is connected to the input node 232 of said output latch 238. This switching transistor 214 is controlled according to the invention in the time domain according to a fine-tuning as it is dictated by the time delay required by the evaluation of the maybe complex logic function 236.

This is done as follows:

A transistor device 215's gate is connected to the dynamic node 234 directly. The transistor device's 215 source-drain line is connected in series between the switching transistor's 214 source-drain line and ground.

Further, delay-controlling elements 209, 210, 212, 213 implemented as inverters are connected in series between said clock signal input node 230 and the control gate of said switching transistor device 214.

The transistors T7, and T8 and T1 and T2 have driving characteristics, because there are many of these complex logic gates 236 to be supplied with clock pulses.

The time-controlling elements, transistors 209, 210, 212, 213 are dimensioned such that a predetermined time delay is imparted to the control gate of the switching transistor device 214, such that the time control of the switching transistor device 214 stabilizes the bit value, which is present on the latch input node 232 against its instability caused as described above. The operation of the circuit works for protecting the output latch against instability, in particular in the most critical case, which will be described next:

The latch 238 is assumed to be set to 1, and the dynamic node 234 is precharged to 1. During the coming up evaluation phase the node 234 is pulled to 0, so that the latch 238 doesn't change its state.

The clock (CLK) turns off the precharging thru transistors T1, T2, T3, T4 as well as transistor T15. At the same time the foot device 211 T11 is turned ON thru transistors T7, T8, T9, T10. This leads to the evaluation of the input variables Hi, Ii and to a transition from 1 to 0 of the dynamic node 234. It should be noted that in prior art this transition would cause a drop on the 11_node so that the latch may change its state and the preceding domino gate switches its state unrecoverably.

The latch comprising transistors T17 to T20 is still not affected, i.e., it does not "see" a large dip on 11_node 32, because the transistor 214 T14 protects the latch from changing its state.

Figure 1:
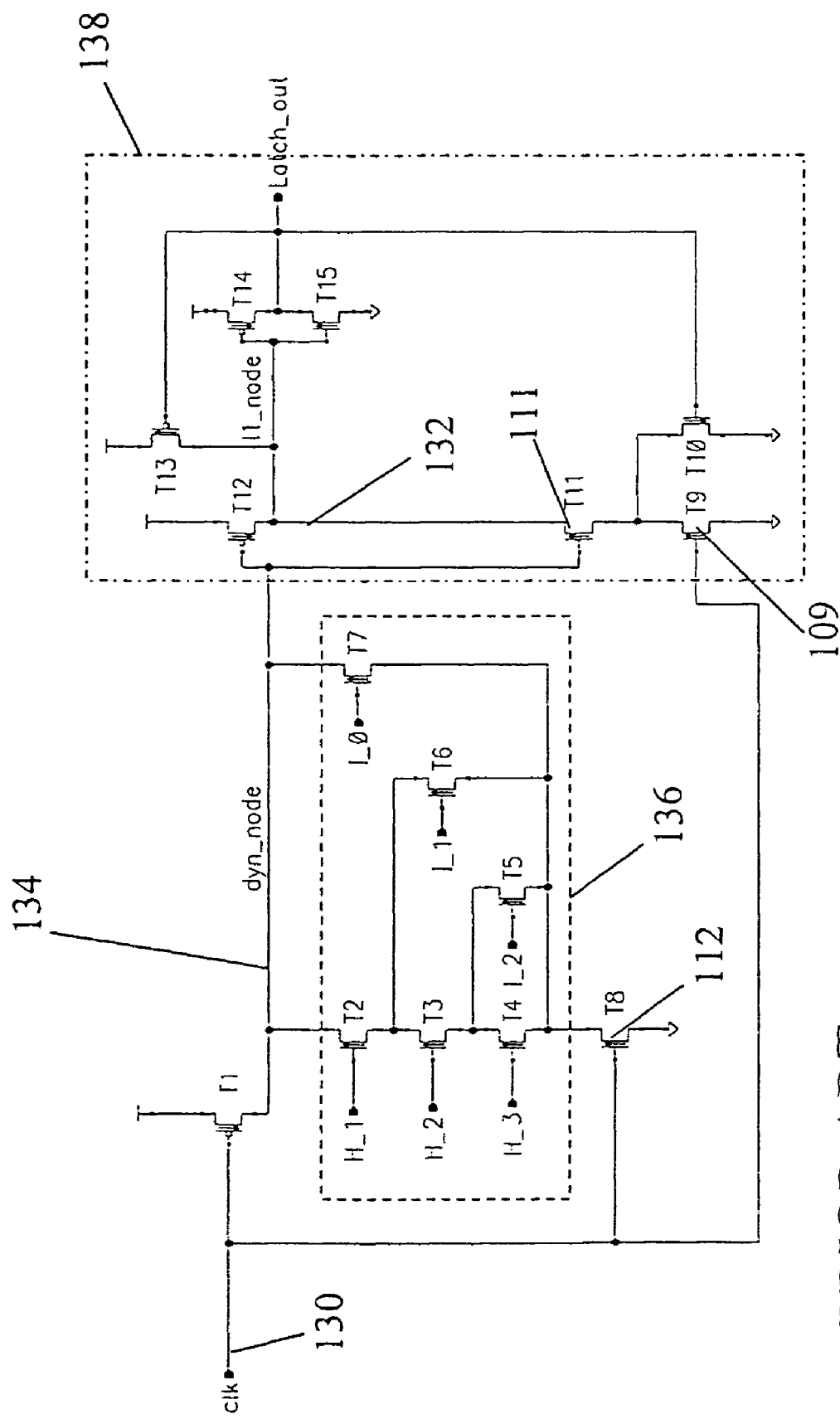
FIG. 1 is a schematic circuit diagram according to prior art illustrating a logic function having the input variables H_1, H_2 and H_3, as well as I_0 and I_1 and a output latch for saving the output states when evaluating the function.

Transistor T15, which was turned ON during precharge, might still be ON during the transition from 1 to 0 of the dynamic node 234. It should be noted that in the prior art implementation in FIG. 1 there is no controlled protection of the latch state by this transition. The circuitry of the present invention implements a fine-tuned time delay, tuned according to the evaluation delay of the logic function 236, which turns ON the switching transistor 214 (T14) right at the moment, when the dynamic node 234 has reached its valid state and when transistor 215 T15 is again in a saturated state. The delay between the activating of the foot device 211 T11 and the latch control device 214 T14 is adjusted thru the transistor devices T9, T10 and T12, T13. Thus, the latch is kept stable. With the described circuitry the most complex logic functions can now be implemented and still keep the latch stable, supposed the fine-tuning is adjusted to the time behavior of the logic function 236.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An integrated circuit comprising a dynamic logic function implementing a predetermined logic function with a plurality of transistor stacks, the integrated circuit including a precharge node at an input of said logic function implementation, an output latch connected to an output node of said logic function for stabilizing the result of the evaluation of said logic function, in order to avoid switching the latch due to a precharge pulse imparted to said precharge node, said integrated circuit comprising:

(a) a gate of a switching transistor device connected to an input node for receiving a clock signal shared with said logic function, the drain thereof being connected to the input node of said output latch;

(b) a gate of a second transistor device being connected to said precharge node, with the source of said transistor device being connected directly to ground and with a drain thereof being connected to a source input of said switching transistor;

(c) time-delay-controlling elements connected between said clock signal input node and the control input of said switching transistor device; and (d) said time-delay controlling elements being dimensioned such that a predetermined delay is imparted to the control input of said switching transistor device, wherein time control of the switching transistor device is implemented such that it stabilizes the bit value present on the latch input node against its instability caused by the switching delay of said logic function.

2. The integrated circuit according to claim 1, wherein said transistor stacks are NFET stacks.

3. The integrated circuit according to claim 1, wherein said time-delay-controlling elements are implemented as inverters.

4. The integrated circuit according to claim 1, wherein said dynamic logic function is of the DOMINO type.

5. A digital processing unit including integrated circuits according to claim 1.

6. A digital processing system comprising one or more digital processing units according to claim 5.

* * * * *